(12) United States Patent
Hsieh et al.

(10) Patent No.: US 12,165,984 B2
(45) Date of Patent: *Dec. 10, 2024

(54) SEMICONDUCTOR DEVICE PACKAGE

(71) Applicant: Advanced Semiconductor Engineering, Inc., Kaohsiung (TW)

(72) Inventors: Hao-Chih Hsieh, Kaohsiung (TW); Tun-Ching Pi, Kaohsiung (TW); Sung-Hung Chiang, Kaohsiung (TW); Yu-Chang Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/903,921

(22) Filed: Sep. 6, 2022

(65) Prior Publication Data
US 2022/0415810 A1    Dec. 29, 2022

Related U.S. Application Data

(63) Continuation of application No. 16/560,862, filed on Sep. 4, 2019, now Pat. No. 11,437,322.

(60) Provisional application No. 62/741,492, filed on Oct. 4, 2018, provisional application No. 62/728,720, filed on Sep. 7, 2018.

(51) Int. Cl.
| | |
|---|---|
| H01L 23/538 | (2006.01) |
| H01L 23/13 | (2006.01) |
| H01L 23/31 | (2006.01) |
| H01L 23/552 | (2006.01) |
| H01L 25/16 | (2023.01) |

(52) U.S. Cl.
CPC .......... *H01L 23/5385* (2013.01); *H01L 23/13* (2013.01); *H01L 23/3121* (2013.01); *H01L 23/5384* (2013.01); *H01L 23/5386* (2013.01); *H01L 23/5389* (2013.01); *H01L 23/552* (2013.01); *H01L 25/16* (2013.01)

(58) Field of Classification Search
CPC ..... H01L 23/5389; H01L 23/13; H01L 25/16; H01L 23/552; H01L 23/5385; H01L 23/5386; H01L 23/5384; H01L 23/3121; H01L 24/16; H01L 2924/1815; H01L 2924/19105
See application file for complete search history.

(56) References Cited

U.S. PATENT DOCUMENTS

| | | |
|---|---|---|
| 7,829,992 B2 | 11/2010 | Sugino et al. |
| 7,872,343 B1 | 1/2011 | Berry |
| 2004/0110340 A1 | 6/2004 | Kim et al. |

(Continued)

FOREIGN PATENT DOCUMENTS

CN    104347558 A    2/2015

OTHER PUBLICATIONS

Final Office Action for U.S. Appl. No. 16/409,665, issued, Apr. 29, 2022, 22 pages.

(Continued)

*Primary Examiner* — Ratisha Mehta
(74) *Attorney, Agent, or Firm* — FOLEY & LARDNER LLP

(57) ABSTRACT

A semiconductor device package includes a number of interposers mounted to the carrier, wherein the number of interposers may be arranged in an irregular pattern.

10 Claims, 10 Drawing Sheets

(56) References Cited

U.S. PATENT DOCUMENTS

| | | |
|---|---|---|
| 2006/0110941 A1 | 5/2006 | Yen et al. |
| 2006/0151203 A1 | 7/2006 | Krueger et al. |
| 2006/0163587 A1 | 7/2006 | Erchak et al. |
| 2007/0131648 A1 | 6/2007 | Shim et al. |
| 2010/0090322 A1 | 4/2010 | Hedler et al. |
| 2010/0200898 A1 | 8/2010 | Lin et al. |
| 2010/0237039 A1 | 9/2010 | Candler |
| 2011/0115066 A1 | 5/2011 | Kim et al. |
| 2011/0210444 A1* | 9/2011 | Jeng ................. H01L 24/97 257/E23.173 |
| 2011/0266674 A1 | 11/2011 | Hsia et al. |
| 2012/0193779 A1* | 8/2012 | Lee .............. H01L 23/3135 257/737 |
| 2013/0093088 A1 | 4/2013 | Chau et al. |
| 2013/0257462 A1 | 10/2013 | Ding et al. |
| 2015/0287672 A1 | 10/2015 | Yazdani |
| 2016/0126220 A1 | 5/2016 | Chen et al. |
| 2017/0103951 A1 | 4/2017 | Lee et al. |
| 2017/0243826 A1* | 8/2017 | Lin ................. H01L 21/4853 |
| 2017/0287825 A1* | 10/2017 | Lee .................... H01L 24/20 |
| 2018/0090449 A1 | 3/2018 | Jeong et al. |
| 2018/0158768 A1* | 6/2018 | Kim ............... H01L 23/49811 |
| 2018/0269181 A1* | 9/2018 | Yang ................ H01L 25/0652 |
| 2019/0057931 A1* | 2/2019 | Hsu ................. H01L 21/6835 |
| 2019/0074267 A1* | 3/2019 | Yang .................. H01L 25/16 |
| 2019/0088621 A1* | 3/2019 | Yang ................... H01L 23/538 |
| 2019/0139853 A1 | 5/2019 | Oh et al. |
| 2019/0206813 A1 | 7/2019 | Kim et al. |
| 2019/0378795 A1* | 12/2019 | Lee ..................... H01L 25/50 |
| 2021/0272922 A1 | 9/2021 | Alves Dias et al. |

OTHER PUBLICATIONS

Final Office Action for U.S. Appl. No. 16/560,862, issued Feb. 15, 2022, 13 pages.

Non-Final Office Action for U.S. Appl. No. 16/409,665, issued Nov. 17, 2021, 19 pages.

Non-Final Office Action for U.S. Appl. No. 16/409,665, issued Oct. 19, 2020, 15 pages.

Non-Final Office Action for U.S. Appl. No. 16/560,862, issued Apr. 13, 2021, 13 pages.

Notice of Allowance for U.S. Appl. No. 16/560,862, issued May 2, 2022, 8 pages.

US Office Action for U.S. Appl. No. 16/409,665, issued Apr. 16, 2021, 19 pages.

Non-Final Office Action for U.S. Appl. No. 17/876,468, issued Oct. 13, 2023, 16 pages.

Final Office Action for U.S. Appl. No. 17/876,468, issued Mar. 29, 2024, 25 pages.

Notice of Allowance for U.S. Appl. No. 17/876,468, issued Jun. 17, 2024, 10 pages.

* cited by examiner

SEMICONDUCTOR DEVICE PACKAGE

CROSS-REFERENCE TO RELATED APPLICATIONS

This application is a continuation of U.S. patent application Ser. No. 16/560,862 filed Sep. 4, 2019, now issued as U.S. Pat. No. 11,437,322, which claims priority to and benefit of U.S. Provisional Application No. 62/728,720, filed Sep. 7, 2018, and U.S. Provisional Application No. 62/741,492, filed Oct. 4, 2018, the contents of which are incorporated herein by reference in their entireties.

BACKGROUND

1. Technical Field

The instant disclosure relates to a semiconductor device package having at least one interposer.

2. Description of Related Art

In order to increase package density, a dual-side assembly is employed for semiconductor package technology. That is, an electronic component could be mounted to a side of the carrier which faces the printed circuit board that the carrier connects or mounted to a side of the carrier which connects to the external component. Further, the electronic component is encapsulated by the molding compound.

SUMMARY

According to one example embodiment of the instant disclosure, a semiconductor device package comprises a carrier, a number of the first interposers, a first encapsulant and a second encapsulant. The carrier has a first surface and a second surface opposite to the first surface. The first interposers are disposed in the first surface of the carrier. The first encapsulant encapsulates the first surface of the carrier and the first interposers. Further, the first encapsulant separates one first interposer of the first interposers from another one of the number of the first interposers. The second encapsulant encapsulates the second surface of the carrier. These first interposers are arranged in an irregular pattern.

According to another example embodiment of the instant disclosure, a semiconductor device package comprises a carrier and a first interposer. The carrier has a first surface and the first interposer is disposed on the first surface of the carrier. Further, the first interposer comprises a conductive via having a sandglass-shaped cross-section.

In order to further understand the instant disclosure, the following embodiments are provided along with illustrations to facilitate appreciation of the instant disclosure; however, the appended drawings are merely provided for reference and illustration, without any intention to limit the scope of the instant disclosure.

DETAILED DESCRIPTION

The aforementioned illustrations and following detailed descriptions are by way of example for the purpose of further explaining the scope of the instant disclosure. Other objectives and advantages related to the instant disclosure will be illustrated in the subsequent descriptions and appended drawings.

Figure 1A:
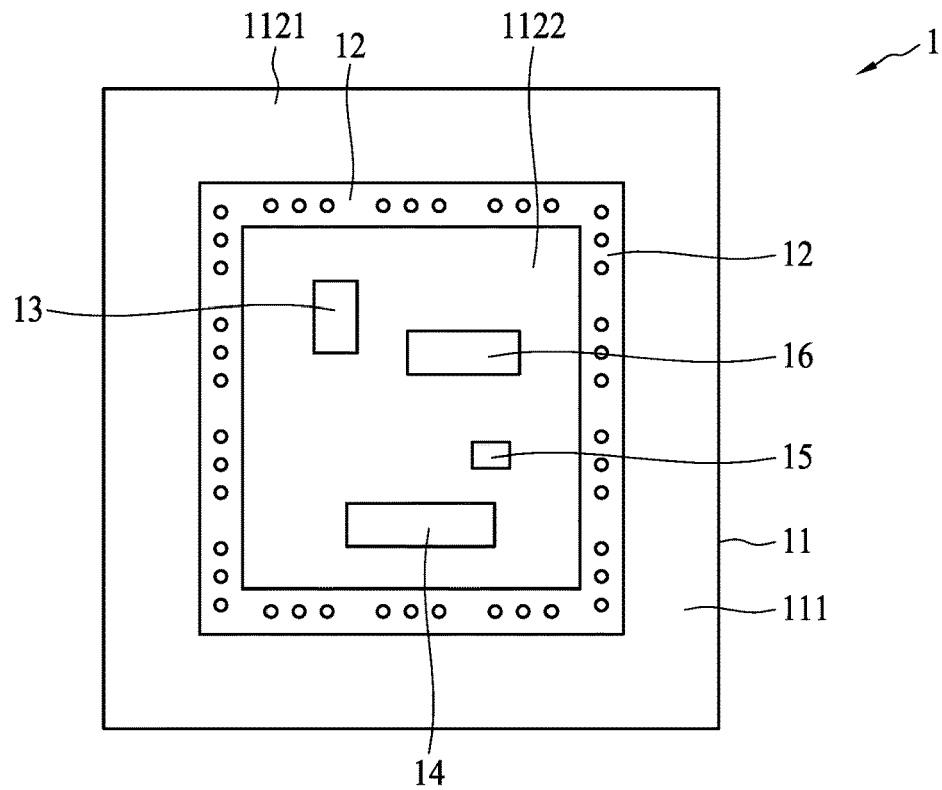
FIG. 1A is a top view of a semiconductor device package in accordance with an embodiment of the instant disclosure.

FIG. 1A shows a semiconductor device package 1 in accordance with an embodiment of the instant disclosure. With reference to FIG. 1A, the semiconductor device package 1 of this embodiment includes a carrier 11, wherein the carrier 11 may be a PCB board or a substrate. An interposer 12 and several components 13, 14, 15, 16 may be disposed on the surface 111 of the carrier 11. The interposer 12 may be ring-shaped and the components 13, 14, 15, 16 may be surrounded by the interposer 12. Referring to FIG. 1A, the surface 111 of the carrier 11 is substantially divided into two regions 1121, 1122, wherein the region 1121 is located outside the ring shaped interposer 12 and the region 1122 is located within the ring shaped interposer 12.

Figure 1B:
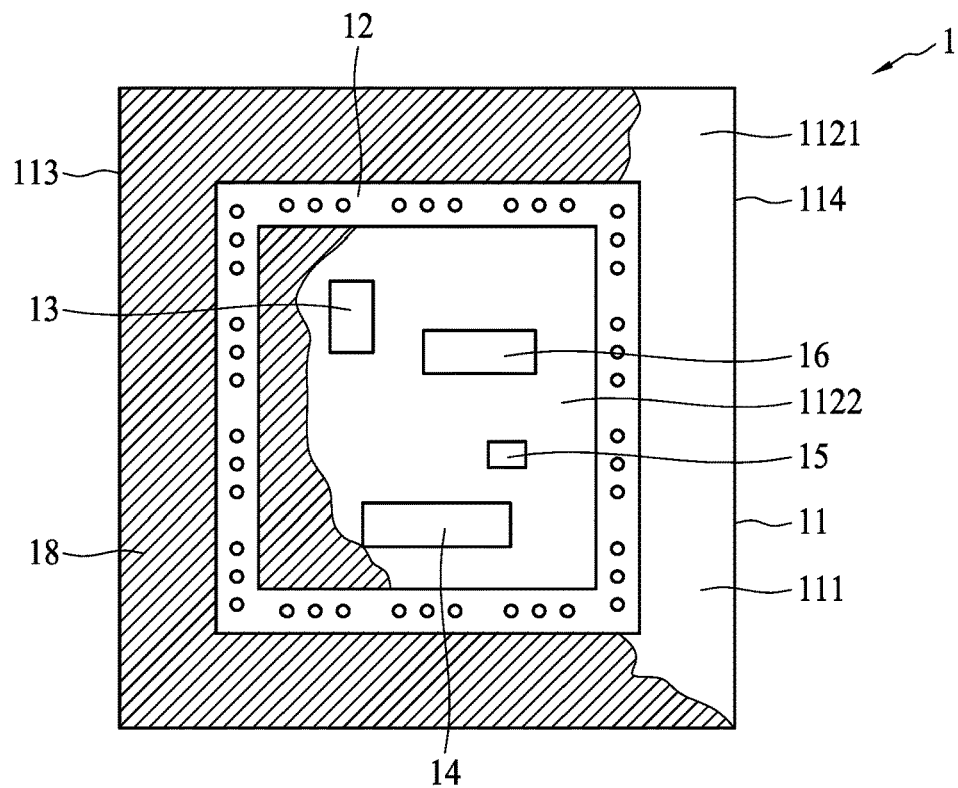
FIG. 1B shows a semiconductor device package in accordance with an embodiment of the instant disclosure under a molding process.

When the encapsulating material 18 will be formed on the surface 111 of the carrier 11 and encapsulate the interposers 12 and the components 13, 14, 15 and 16 by using the molding process, the flow of the encapsulating material 18 will be uneven (with reference to FIG. 1B). When the flow of the encapsulating material 18 may flow form the side 113 of the carrier 11 toward the side 114 of the carrier 11, the flow rate of the encapsulating material 18 which flows through the region 1121 may be greater than the flow rate of the encapsulating material 18 which flows through the region 1122. As shown in FIG. 1B, most of the region 1121 is covered by the encapsulating material 18 but a small part of the region 1122 is covered by the encapsulating material 18.

Figure 2A:
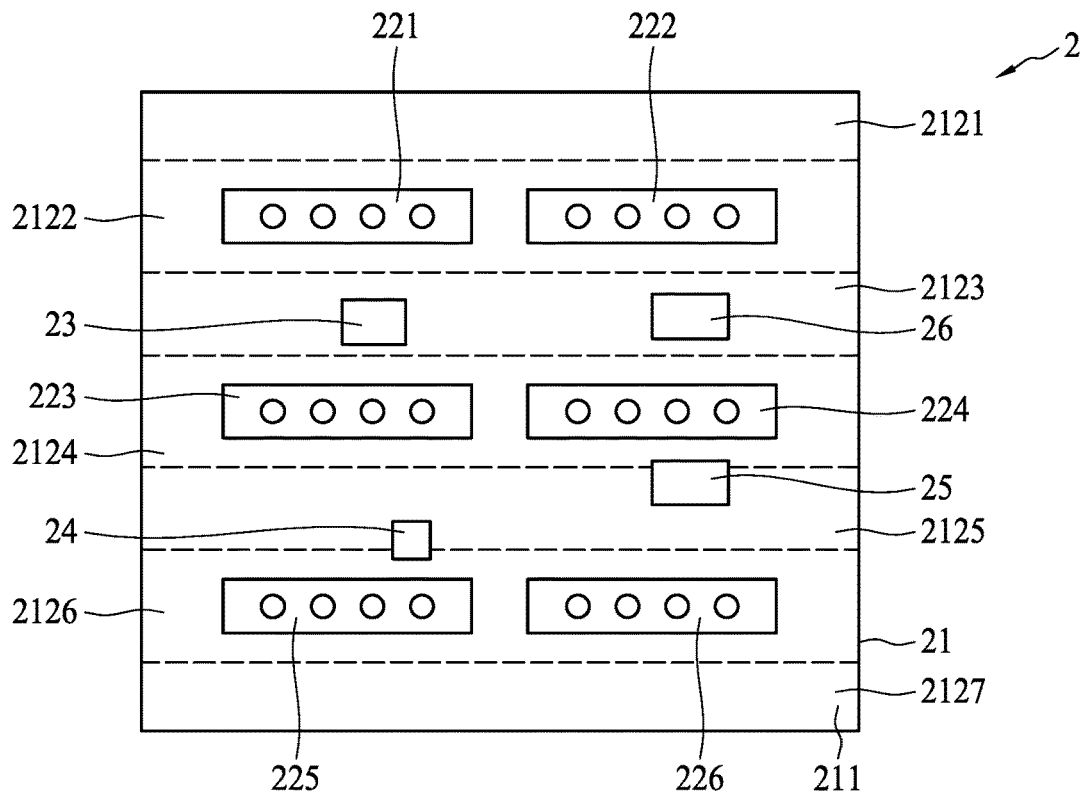
FIG. 2A is a top view of a semiconductor device package in accordance with another embodiment of the instant disclosure.

FIG. 2A shows a semiconductor device package 2 in accordance with an embodiment of the instant disclosure. With reference to FIG. 2A, the semiconductor device package 2 of this embodiment includes a carrier 21, wherein the carrier 21 may be a PCB board or a substrate. A number of the interposers 221, 222, 223, 224, 225, 226 and several components 23, 24, 25, 26 may be disposed on the surface 211 of the carrier 2. The interposers 221 and 222 may be substantially aligned with each other. The interposers 223 and 224 may be substantially aligned with each other. The interposers 225 and 226 may be substantially aligned with each other. Referring to FIG. 2A, the surface 211 of the carrier is divided into seven regions. The regions 2121, 2123, 2125 and 2125 do not have any interposer. The region 2122 comprises the interposers 221 and 222. The region 2124 comprises the interposers 223 and 224. The region 2126 comprises the interposers 225 and 226.

Figure 2B:
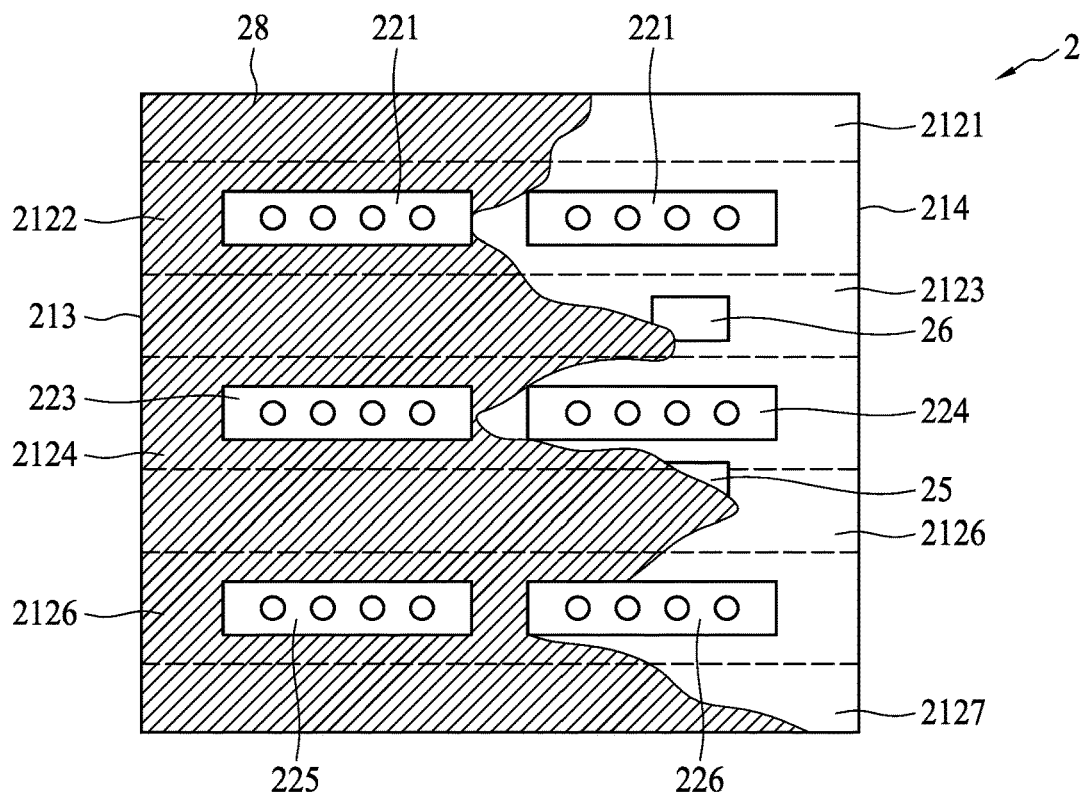
FIG. 2B shows a semiconductor device package in accordance with another embodiment of the instant disclosure under a molding process.

When the encapsulating material 28 will be formed on the surface 211 of the carrier 21 and encapsulate the interposers 221, 222, 223, 224, 225, 226 and the components 23, 24, 25 and 26 by using the molding process, the flow of the encapsulating material 28 will uneven (with reference to FIG. 2B). When the flow of the encapsulating material 28 may flow form the side 213 of the carrier 21 toward the side 214 of the carrier 21, the flow rate of the encapsulating material 28 which flows through the regions 2121, 2123, 2125, 2127 may be greater than the flow rate of the encapsulating material 18 which flows through the regions 2122, 2124, 2126. As shown in FIG. 2B, most of the regions 2121, 2123, 2125, 2127 are covered by the encapsulating material 28 but small parts of the regions 2122, 2124, 2126 are covered by the encapsulating material 28.

Figure 3A:
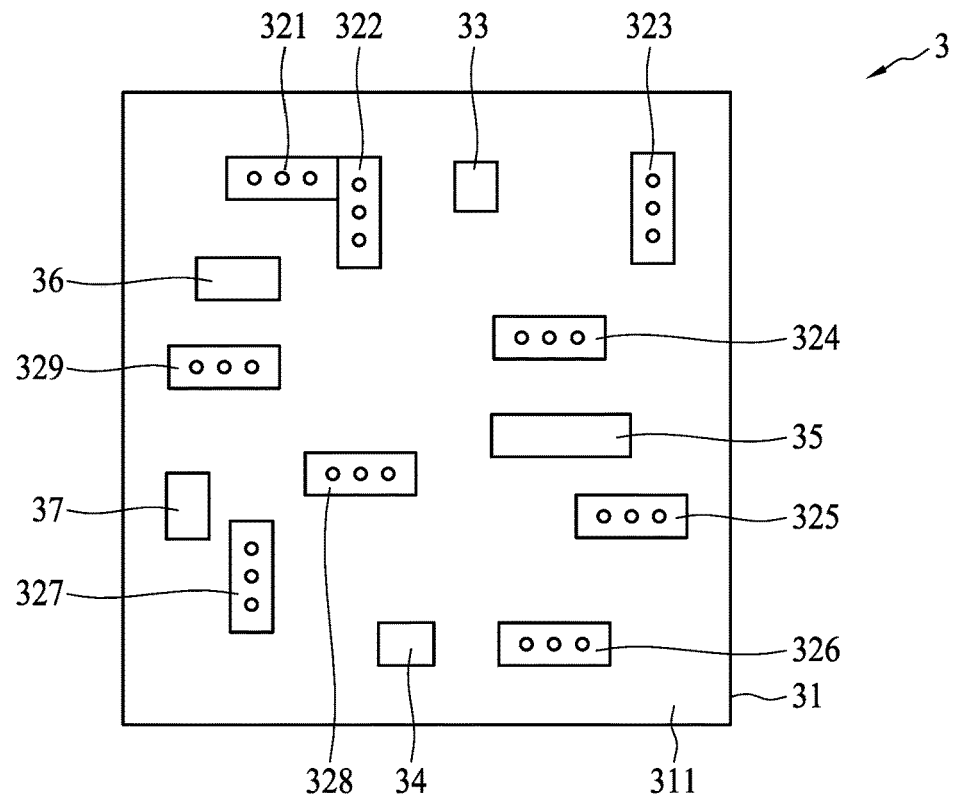
FIG. 3A is a top view of a semiconductor device package in accordance with another embodiment of the instant disclosure.

FIG. 3A shows a semiconductor device package 3 in accordance with an embodiment of the instant disclosure. With reference to FIG. 3A, the semiconductor device package 3 of this embodiment includes a carrier 31, wherein the carrier 21 may be a PCB board or a substrate. A number of the interposers 321, 322, 323, 324, 325, 326, 327, 328, 329 and several components 33, 34, 35, 36, 37 may be disposed on the surface 311 of the carrier 3. The interposers 321, 322, 323, 324, 325, 326, 327, 328, 329 may be randomly arranged on the surface 311 of the carrier 3. That is, the interposers 321, 322, 323, 324, 325, 326, 327, 328, 329 may be arranged in an irregular pattern. It means that the pattern formed by the arrangement of the interposers 321, 322, 323, 324, 325, 326, 327, 328, 329 is not regular in shape or form. Referring to FIG. 3A, it looks like that the interposers 321, 322, 323, 324, 325, 326, 327, 328, 329 are scattered on the carrier 31. Further, the pattern formed by the arrangement of the interposers 321, 322, 323, 324, 325, 326, 327, 328, 329 is not a regular geometric shape. In addition, at least one of the interposers 321, 322, 323, 324, 325, 326, 327, 328, 329 may have a redistribution layer. Moreover, the interposers 321 and 322 which may be arranged in an L-shaped may be integrated with each other.

Figure 3B:
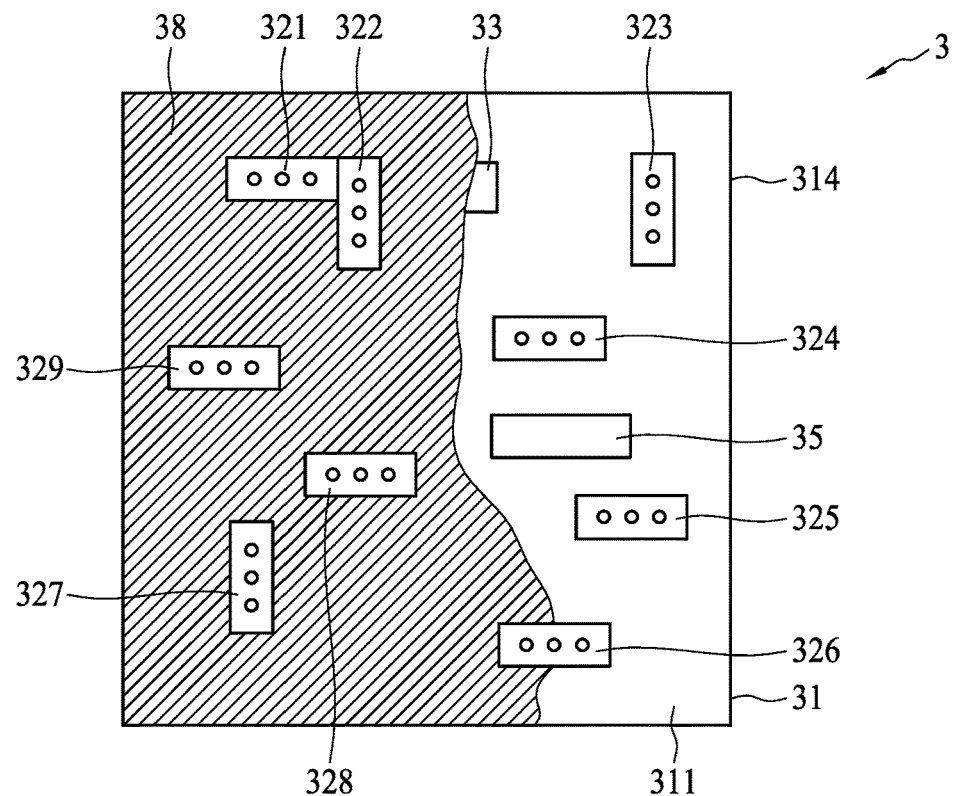
FIG. 3B shows a semiconductor device package in accordance with another embodiment of the instant disclosure under a molding process.

When the encapsulating material 38 will be formed on the surface 311 of the carrier 31 and encapsulate the interposers 321, 322, 323, 324, 325, 326, 327, 328, 329 and the components 33, 34, 35, 36, 37 by using the molding process, the flow of the encapsulating material 28 will be smooth (with reference to FIG. 3B). For example, as shown in FIG. 3B, the encapsulating material 38 flows from the form the side 313 of the carrier 31 toward the side 314 of the carrier 31. When the encapsulating material 38 flows to the middle portion of the surface 311 of the carrier 31, most of the left half part of the surface 311 of the carrier 31 is covered by the encapsulating material 38. Thus, when the encapsulating material 38 flows to the side of the 314 of the carrier 31, most of the surface 311 of the carrier 31 will be covered by the encapsulating material 38.

Figure 4A:
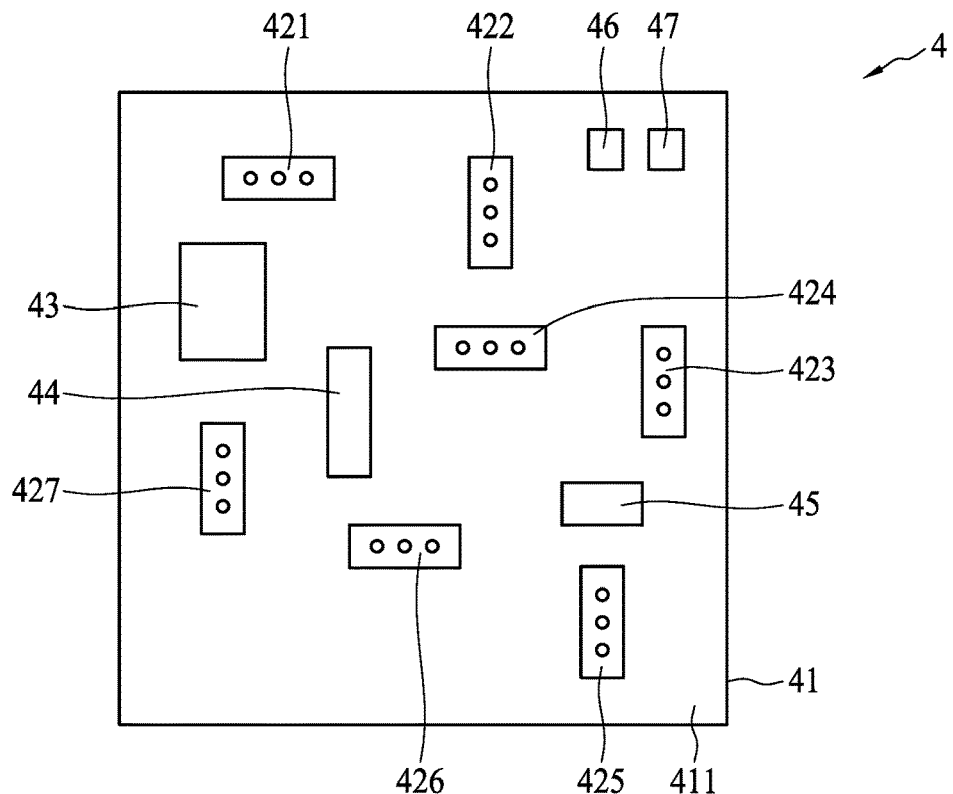
FIG. 4A is a top view of a semiconductor device package in accordance with another embodiment of the instant disclosure.

FIG. 4A shows a semiconductor device package 4 in accordance with an embodiment of the instant disclosure. With reference to FIG. 4A, the semiconductor device package 4 of this embodiment includes a carrier 41, wherein the carrier 21 may be a PCB board or a substrate. A number of the interposers 421, 422, 423, 424, 425, 426, 427 and several components 43, 44, 45, 46, 47 may be disposed on the surface 411 of the carrier 4. The interposers 421, 422, 423, 424, 425, 426, 427 may be randomly arranged on the surface 411 of the carrier 4. That is, the interposers 421, 422, 423, 424, 425, 426, 427 may be arranged in an irregular pattern. It means that the pattern formed by the arrangement of the interposers 421, 422, 423, 424, 425, 426, 427 is not regular in shape or form. Referring to FIG. 4A, it looks like that the interposers 421, 422, 423, 424, 425, 426, 427 are scattered on the carrier 41. Further, the pattern formed by the arrangement of the interposers 421, 422, 423, 424, 425, 426, 427 is not a regular geometric shape.

Figure 4B:
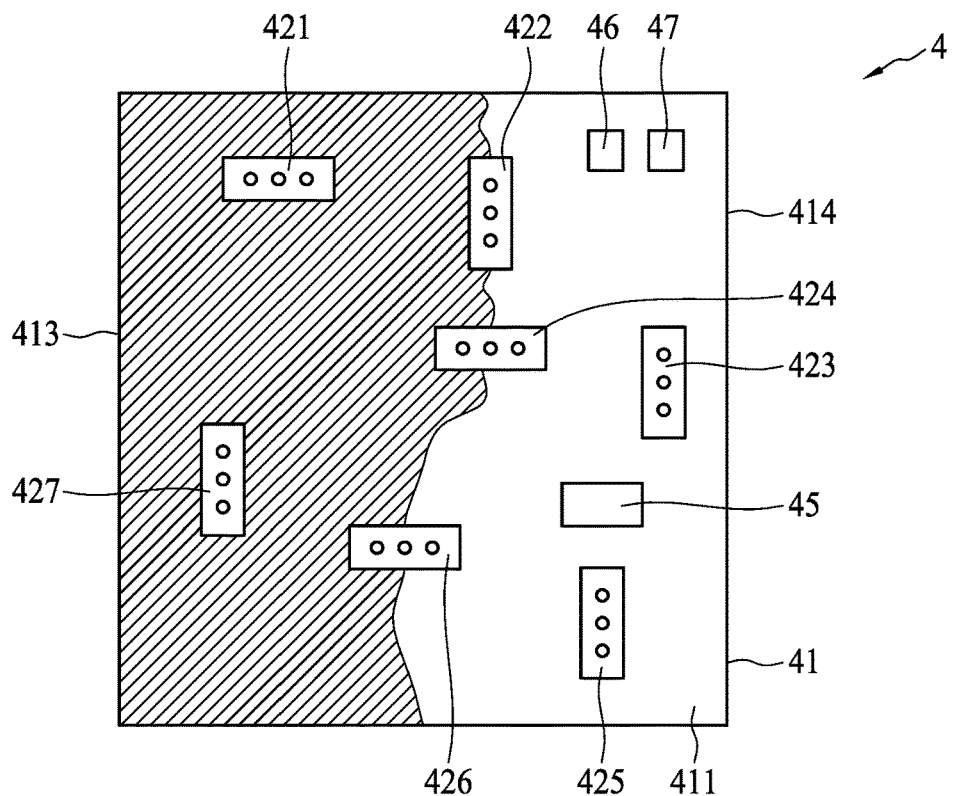
FIG. 4B shows a semiconductor device package in accordance with another embodiment of the instant disclosure under a molding process.

When the encapsulating material 48 will be formed on the surface 411 of the carrier 41 and encapsulate the interposers 421, 422, 423, 424, 425, 426, 427 and the components 43, 44, 45, 46, 47 by using the molding process, the flow of the encapsulating material 28 will be smooth (with reference to FIG. 4B). For example, as shown in FIG. 4B, the encapsulating material 48 flows from the form the side 413 of the carrier 41 toward the side 414 of the carrier 41. When the encapsulating material 48 flows to the middle portion of the surface 411 of the carrier 41, most of the left half part of the surface 411 of the carrier 41 is covered by the encapsulating material 48. Thus, when the encapsulating material 48 flows to the side of the 414 of the carrier 41, most of the surface 411 of the carrier 41 will be covered by the encapsulating material 48.

Figure 5A:
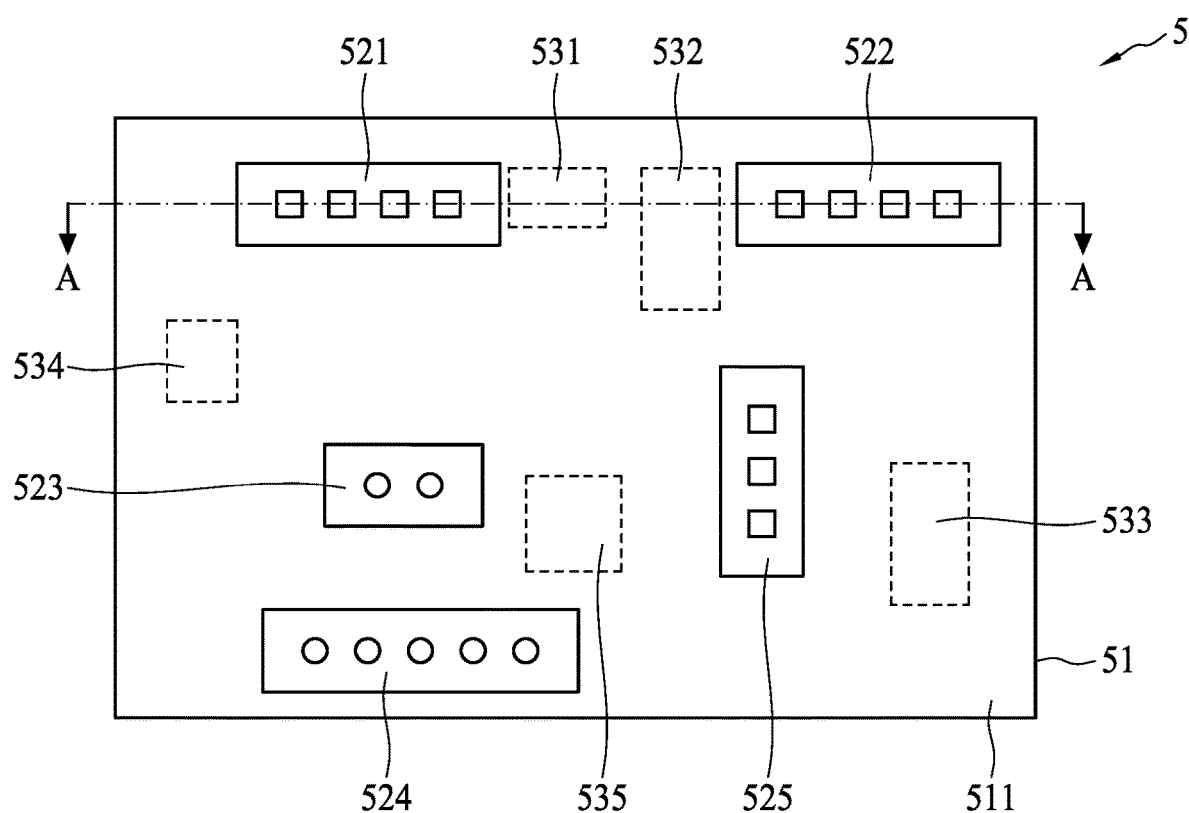
FIG. 5A is a top view of a semiconductor device package in accordance with another embodiment of the instant disclosure.

FIG. 5A shows a semiconductor device package 5 in accordance with an embodiment of the instant disclosure. With reference to FIG. 5A, the semiconductor device package 5 of this embodiment includes a carrier 51, wherein the carrier 51 may be a PCB board or a substrate. A number of the interposers 521, 522, 523, 524, 525 and several components 531, 532, 533, 534, 535 may be disposed on the surface 511 of the carrier 5. The interposers 521, 522, 523, 524, 525 may be randomly arranged on the surface 511 of the carrier 5. That is, the interposers 521, 522, 523, 524, 525 may be arranged in an irregular pattern. It means that the pattern formed by the arrangement of the interposers 521, 522, 523, 524, 525 is not regular in shape or form. Referring to FIG. 5A, it looks like that the interposers 521, 522, 523, 524, 525 are scattered on the carrier 51. Further, the pattern formed by the arrangement of the interposers 521, 522, 523, 524, 525 is not a regular geometric shape. In addition, at least one of the interposers 521, 522, 523, 524, 525 may have a redistribution layer. Moreover, an encapsulating material 53 may be disposed on the surface 511 of the carrier 51 and may encapsulate the interposers 521, 522, 523, 524, 525 and the components 531, 532, 533, 534, 535.

Figure 5B:
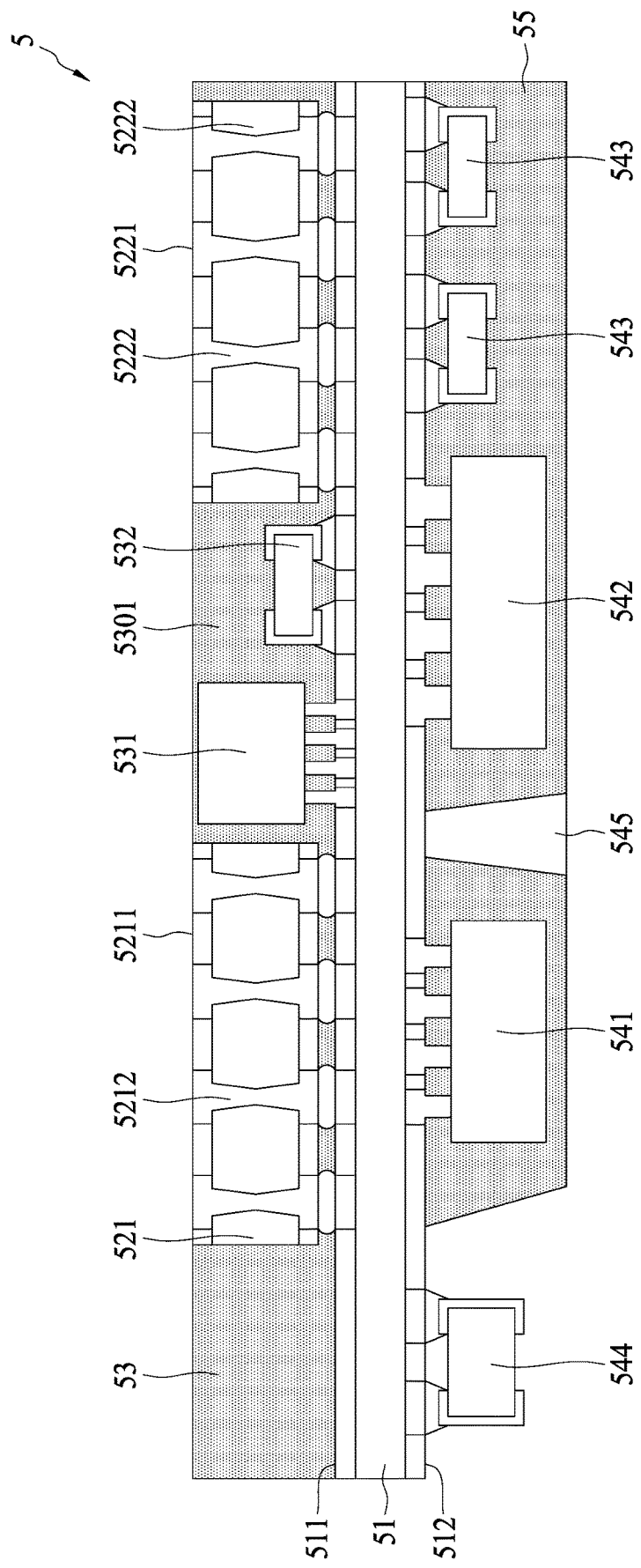
FIG. 5B illustrates a cross-sectional view along line I-I in FIG. 5A.

FIG. 5B illustrates a cross-sectional view along line I-I in FIG. 5A. As shown in FIG. 5B, the encapsulating material 53 may encapsulate the surface 511 of the carrier, the components 531, 532 and the laterals sides of the interposers 521 and 522. Especially, the interposer 521 and the interposer 522 may be separated from each other by the encapsulating material 53. Moreover, a portion of the top surface 5301 of the encapsulating material 53 may be lower than the top surface 5211 of the interposer 521 or the top surface 5221 of the interposer 522. The interposer 521 may comprises a plurality of the conductive vias 5212, and the interposer 522 may comprise a plurality of the conductive vias 5222. Referring to FIG. 5B, each of the conductive vias 5212, 5222 may have a sandglass-shaped cross-section.

In addition, the carrier 51 further comprises a surface 512 which is opposite to the surface 511. The components 541, 542, 543 and 544 may be mounted on the surface 512 of the carrier 51. An encapsulating material 55 may encapsulate a portion of the surface 512 of the carrier 51 and the components 541, 542, 543. That is, there is another portion of the surface 512 of the carrier 51 which is not covered by the encapsulating material 53. Further, as shown in FIG. 5B, the component 544 is disposed on the portion of the surface 512 of the carrier 51 which is not encapsulated by the encapsulating material 53. Therefore, the component 544 is not encapsulated by the encapsulating material 53 as well. In addition, referring to FIG. 5B, a compartment shield structure 545 may be disposed between the components 541 and 542.

Figure 6:
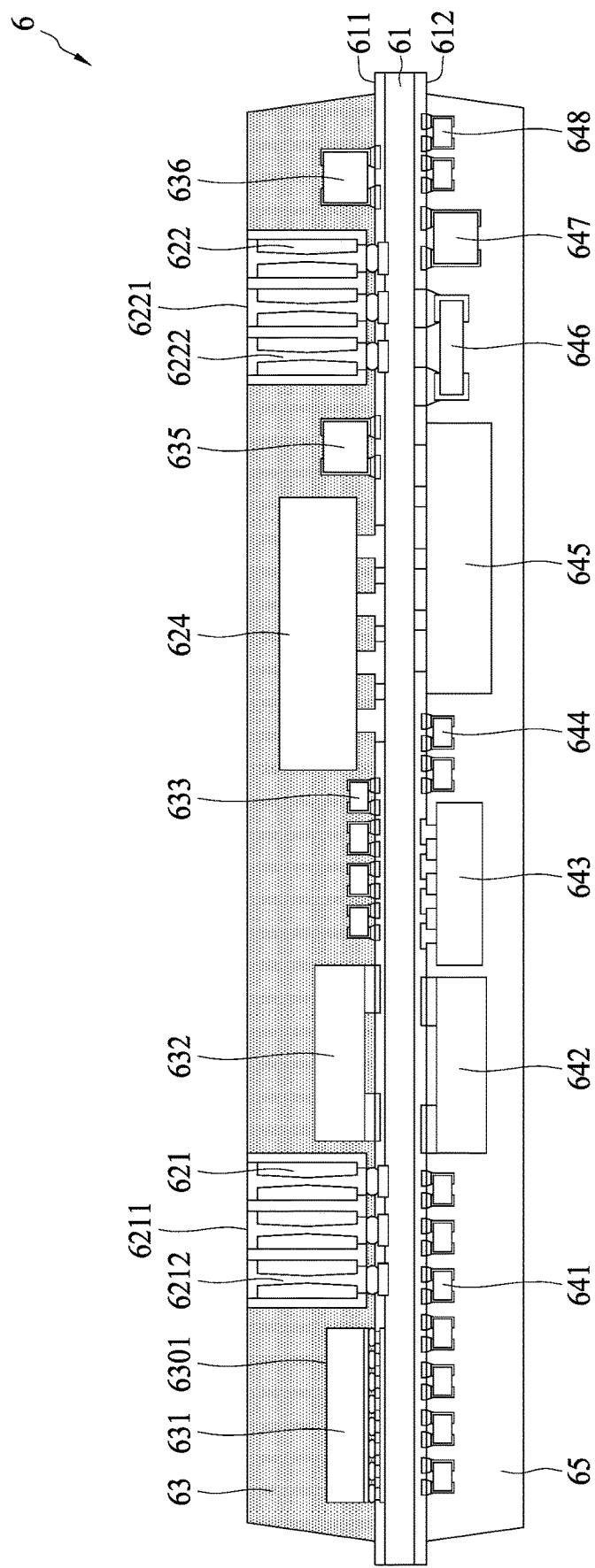
FIG. 6 shows a semiconductor device package in accordance with another embodiment of the instant disclosure.

FIG. 6 shows a semiconductor device package 6 in accordance with an embodiment of the instant disclosure. With reference to FIG. 6, the semiconductor device package 6 may comprise a carrier 61, wherein the carrier 61 may be a PCB board or a substrate. The interposers 621 and 622 and the components 631, 632, 633, 634, 635, 636 may be disposed on the surface 611 of the carrier 61. An encapsulating material 63 may encapsulate the surface 611 of the carrier 61, the components 631, 632, 633, 634, 635, 636 and the lateral sides of the interposers 621 and 622. Especially, the interposer 621 and the interposer 622 may be separated from each other by the encapsulating material 63. Moreover, a portion of the top surface 6301 of the encapsulating material 63 may be lower than the top surface 6211 of the interposer 621 or the top surface 6221 of the interposer 622. The interposer 621 may comprises a plurality of the conductive vias 6212, and the interposer 622 may comprise a plurality of the conductive vias 6222. Referring to FIG. 6, each of the conductive vias 6212, 6222 may have a sandglass-shaped cross-section. The interposer 621 and/or 622 may have a redistribution layer.

In addition, the carrier 61 further comprises a surface 612 which is opposite to the surface 611. The components 641, 642, 643, 644, 645, 646, 647 and 648 may be mounted on the surface 612 of the carrier 61. An encapsulating material 65 may encapsulate the surface 612 of the carrier 61 and the components 641, 642, 643, 644, 645, 646, 647 and 648.

Figure 7:
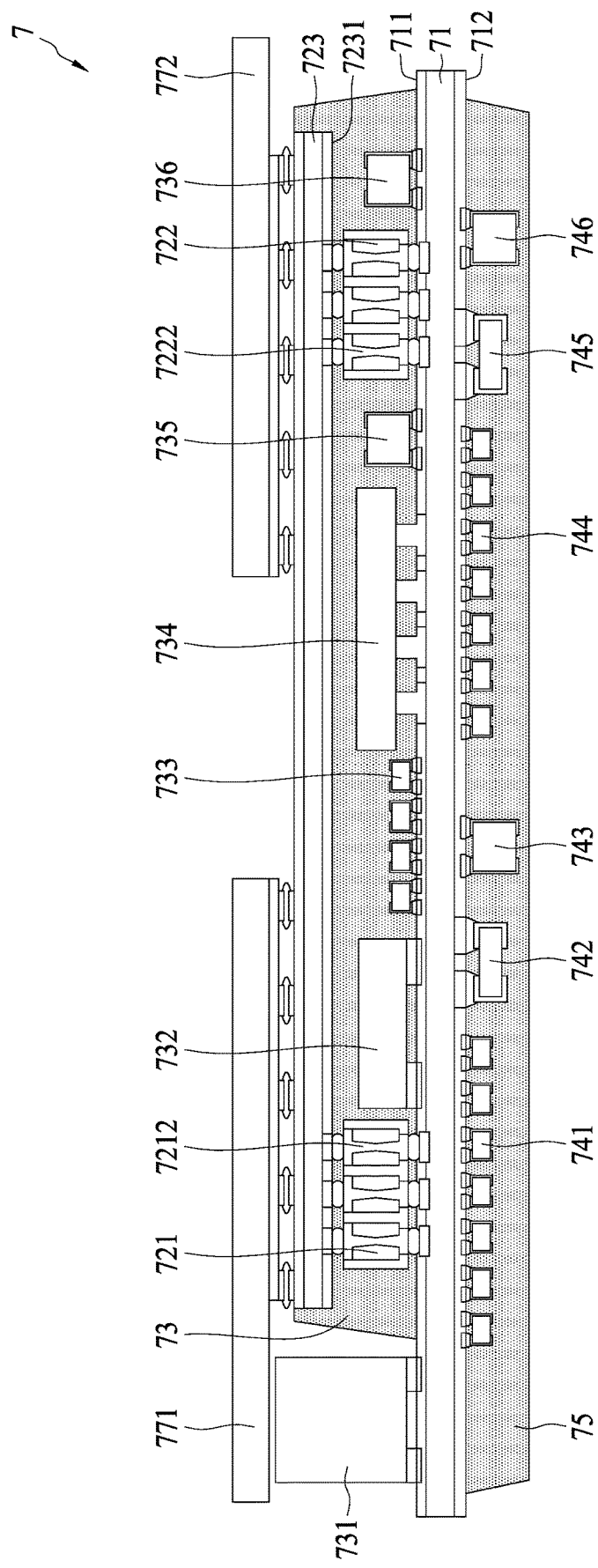
FIG. 7 shows a semiconductor device package in accordance with another embodiment of the instant disclosure.

FIG. 7 shows a semiconductor device package 7 in accordance with an embodiment of the instant disclosure. With reference to FIG. 7, the semiconductor device package 7 may comprise a carrier 71, wherein the carrier 71 may be a PCB board or a substrate. The interposers 721 and 722 and the components 731, 732, 733, 734, 735, 736 may be disposed on the surface 711 of the carrier 71. Further, an interposer 723 may be stacked on the interposers 721 and 722, wherein the interposer 723 may be a PCB board or a substrate. A cross-sectional width of the interposer 723 is smaller than a cross-sectional width of the carrier 71. An encapsulating material 73 may encapsulate a portion of the surface 711 of the carrier 71, the components 732, 733, 734, 735, 736, the interposers 721, 722 and the surface 7231 and the lateral sides of the interposer 723. That is, there is another portion of the surface 711 of the carrier 71 which is not covered by the encapsulating material 73. Further, as shown in FIG. 7, the component 731 is disposed on the portion of the surface 711 of the carrier 71 which is not encapsulated by the encapsulating material 73. Therefore, the component 731 is not encapsulated by the encapsulating material 73 as well.

The interposer 721 and the interposer 722 may be separated from each other by the encapsulating material 73. Moreover, the interposer 721 may comprises a plurality of the conductive vias 7212, and the interposer 722 may comprise a plurality of the conductive vias 7222. Referring to FIG. 7, each of the conductive vias 7212, 7222 may have a sandglass-shaped cross-section. The interposer 721 and/or 722 may have a redistribution layer.

Moreover, referring to FIG. 7, the interposer 723 may have a surface 7232 which is exposed and opposite to the surface 7231. Two components 771, 772 may be disposed on the surface 7232 of the interposer 723. Especially, the components 771, 772 may be PCB boards or substrates.

In addition, the carrier 71 further comprises a surface 712 which is opposite to the surface 711. The components 741, 742, 743, 744, 745, 746, may be mounted on the surface 712 of the carrier 71, wherein all of the components 741, 742, 743, 744, 745, 746 may be passive components. An encapsulating material 75 may encapsulate the surface 712 of the carrier 71 and the components 741, 742, 743, 744, 745, 746.

Figure 8:
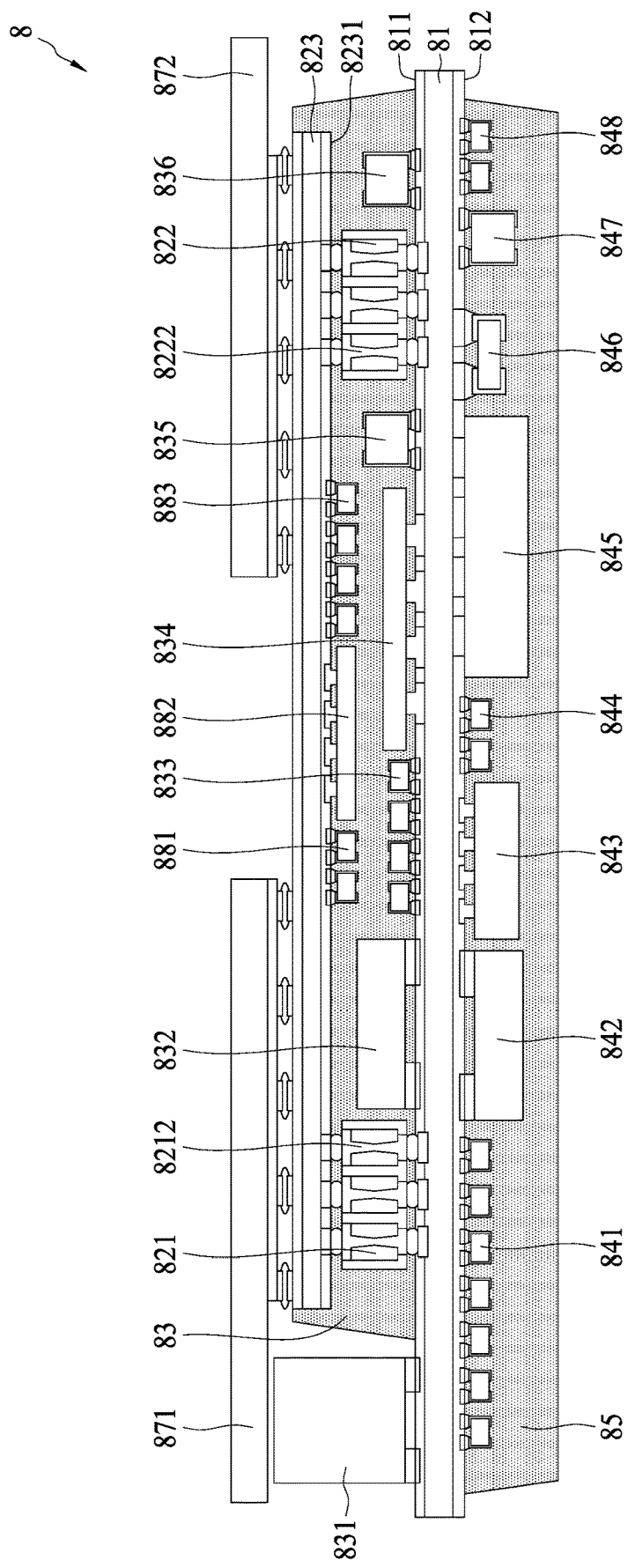
FIG. 8 shows a semiconductor device package in accordance with another embodiment of the instant disclosure.

FIG. 8 shows a semiconductor device package 8 in accordance with an embodiment of the instant disclosure. With reference to FIG. 8, the semiconductor device package 8 may comprise a carrier 81, wherein the carrier 81 may be a PCB board or a substrate. The interposers 821 and 822 and the components 831, 832, 833, 834, 835, 836 may be disposed on the surface 811 of the carrier 81. Further, an interposer 823 may be stacked on the interposers 821 and 822, wherein the interposer 823 may be a PCB board or a substrate. A cross-sectional width of the interposer 823 is smaller than a cross-sectional width of the carrier 81. The interposer 823 may comprise a surface 8231 facing the surface 811 of the carrier 81. The components 881, 882, 883 may be disposed on the surface 8231 of the interposer 823. The interposers 821 and 822 may connect to the surface 8231 of the interposer 823 when the interposer 823 is staked on the interposers 821 and 822. An encapsulating material 83 may encapsulate a portion of the surface 811 of the carrier 81, the components 832, 833, 834, 835, 836, the interposers 821, 822, the components 881, 882, 883 and the surface 8231 and the lateral sides of the interposer 823. That is, there is another portion of the surface 811 of the carrier 81 which is not covered by the encapsulating material 83. Further, as shown in FIG. 8, the component 831 is disposed on the portion of the surface 811 of the carrier 81 which is not encapsulated by the encapsulating material 83. Therefore, the component 831 is not encapsulated by the encapsulating material 83 as well.

The interposer 821 and the interposer 822 may be separated from each other by the encapsulating material 83. Moreover, the interposer 821 may comprises a plurality of the conductive vias 8212, and the interposer 822 may comprise a plurality of the conductive vias 8222. Referring to FIG. 8, each of the conductive vias 8212, 8222 may have a sandglass-shaped cross-section. The interposer 821 and/or 822 may have a redistribution layer.

Moreover, referring to FIG. 8, the interposer 823 may have a surface 8232 which is exposed and opposite to the surface 8231. Two components 871, 872 may be disposed on the surface 8232 of the interposer 823. Especially, the components 871, 872 may be PCB boards or substrates.

In addition, the carrier 81 further comprises a surface 812 which is opposite to the surface 811. The components 841, 842, 843, 844, 845, 846, 847, 848 may be mounted on the surface 812 of the carrier 81. An encapsulating material 85 may encapsulate the surface 812 of the carrier 81 and the components 841, 842, 843, 844, 845, 846, 847, 848.

Figure 9:
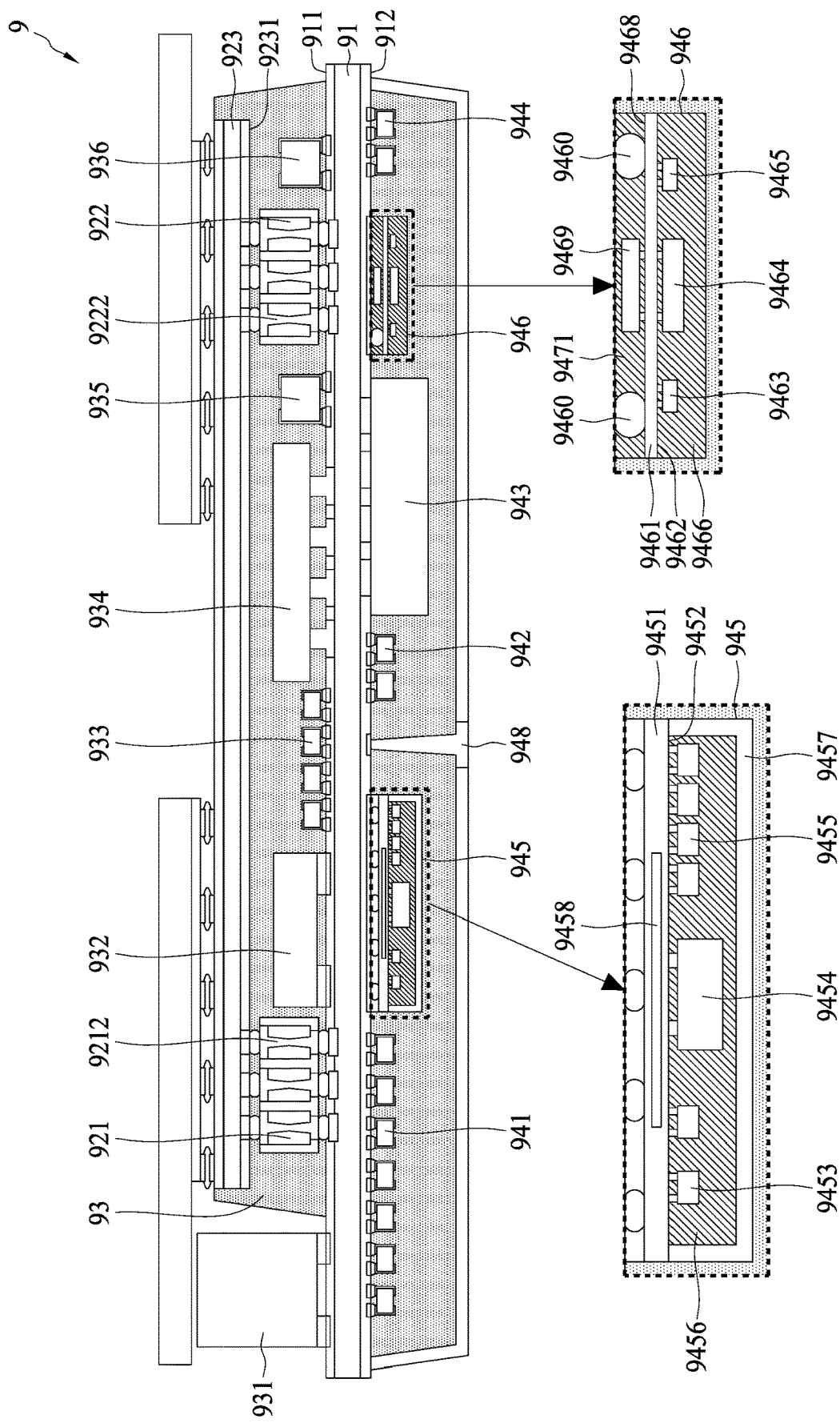
FIG. 9 shows a semiconductor device package in accordance with another embodiment of the instant disclosure.

FIG. 9 shows a semiconductor device package 9 in accordance with an embodiment of the instant disclosure. With reference to FIG. 9, the semiconductor device package 9 may comprise a carrier 91, wherein the carrier 91 may be a PCB board or a substrate. The interposers 921 and 922 and the components 931, 932, 933, 934, 935, 936 may be disposed on the surface 911 of the carrier 91. Further, an interposer 923 may be stacked on the interposers 921 and 922, wherein the interposer 823 may be a PCB board or a substrate. A cross-sectional width of the interposer 923 is smaller than a cross-sectional width of the carrier 91. The interposer 923 may comprise a surface 9231 facing the surface 911 of the carrier 91. An encapsulating material 93 may encapsulate a portion of the surface 911 of the carrier 91, the components 932, 933, 934, 935, 936, the interposers 921, 922 and the surface 9231 and the lateral sides of the interposer 923. That is, there is another portion of the surface 911 of the carrier 91 which is not covered by the encapsulating material 93. Further, as shown in FIG. 9, the component 931 is disposed on the portion of the surface 911 of the carrier 91 which is not encapsulated by the encapsulating material 93. Therefore, the component 931 is not encapsulated by the encapsulating material 93 as well.

The interposer 921 and the interposer 922 may be separated from each other by the encapsulating material 93. Moreover, the interposer 921 may comprises a plurality of the conductive vias 9212, and the interposer 922 may comprise a plurality of the conductive vias 9222. Referring to FIG. 9, each of the conductive vias 9212, 9222 may have a sandglass-shaped cross-section. The interposer 921 and/or 922 may have a redistribution layer.

Moreover, referring to FIG. 9, the interposer 923 may have a surface 9232 which is exposed and opposite to the surface 9231. Two components 971, 972 may be disposed on the surface 9232 of the interposer 923. Especially, the components 971, 972 may be PCB boards or substrates.

In addition, the carrier 91 further comprises a surface 912 which is opposite to the surface 811. The components 941, 942, 943, 944 and the package units 945, 946 may be mounted on the surface 912 of the carrier 91. An encapsulating material 95 may encapsulate the surface 912 of the carrier 91 and the components 941, 942, 943, 944 and the package units 945, 946. A compartment shield structure 948 may be disposed between the package unit 945 and component 942.

Moreover, the package unit 945 may comprise a substrate 9451 having a surface 9452. The components 9453, 9454, 9455 may be mounted on the surface 9452 of the substrate 9451. An encapsulating material 9456 may encapsulate the surface 9452 of the substrate 9451 and the components 9453, 9454, 9455. Further, a shielding layer 9457 may be formed on the encapsulating material 9456 and electrically connected to the substrate 9451. In addition, a component 9458 may be embedded in the substrate 9451.

The package unit 946 may comprise a substrate 9461 having a surface 9462. The components 9463, 9464, 9465 may be mounted on the surface 9462 of the substrate 9461. An encapsulating material 9466 may encapsulate the surface 9462 of the substrate 9461 and the components 9463, 9464, 9465. In addition, the substrate 9461 having a surface 9468 which is opposite to the surface 9462 and facing the surface 912 of the carrier 91. A component 9469 and solder balls 9460 a may be mounted to the surface 9468 of the substrate 9461. The package unit 946 may be mounted to the surface 9468 of the substrate 9461 by the solder balls 9460. An encapsulating material 9471 may encapsulate the surface 9468 of the substrate 9461, the lateral sides of the solder balls 9460 and the components 9469. Further, a shielding layer 9467 may be formed on the encapsulating material 9466 and the encapsulating material 9471 and electrically connected to the substrate 9461.

In addition, an active or a passive die may be embedded in the carrier 91 and/or the substrate 9461.

Reference to the formation or positioning of a first feature over or on a second feature in the instant disclosure may include embodiments in which the first and second features are formed or disposed in direct contact, and may also include embodiments in which additional features may be formed or disposed between the first and second features, such that the first and second features may not be in direct contact.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

For example, substantially parallel can refer to a range of angular variation relative to 0° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, substantially perpendicular can refer to a range of angular variation relative to 90° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the instant disclosure has been described and illustrated with reference to specific embodiments thereof, these descriptions and illustrations are not limiting. It should be understood by those skilled in the art that various changes may be made and equivalents may be substituted without departing from the true spirit and scope of the instant disclosure as defined by the appended claims. The illustrations may not be necessarily drawn to scale. There may be distinctions between the artistic renditions in the instant disclosure and the actual apparatus due to manufacturing processes and tolerances. There may be other embodiments of the instant disclosure which are not specifically illustrated. The specification and drawings are to be regarded as illustrative rather than restrictive. Modifications may be made to adapt a particular situation, material, composition of matter, method, or process to the objective, spirit and scope of the instant disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the instant disclosure. Accordingly, unless specifically indicated herein, the order and grouping of the operations are not limitations of the instant disclosure.

What is claimed is:

1. A semiconductor device package, comprising:
   a carrier having a first surface and a second surface opposite to the first surface;
   a first interposer disposed over the first surface;
   a first encapsulant encapsulating the first interposer and interposed between the first interposer and the carrier; and
   a second encapsulant disposed under the second surface and exposing a portion of the second surface;
   wherein the first encapsulant contacts the first surface of the carrier, and the second encapsulant contacts the second surface of the carrier, and wherein the first encapsulant has a lateral surface connected to an edge of a top surface of the first interposer, and wherein the first encapsulant has an upper surface lower than the top surface of the first interposer and higher than a bottom surface of the first interposer with respect to the first surface of the carrier.

2. A semiconductor device package, comprising:
   a carrier having a first surface and a second surface opposite to the first surface;
   a first interposer disposed over the first surface;
   a first encapsulant encapsulating the first interposer and interposed between the first interposer and the carrier;
   a second encapsulant disposed under the second surface and exposing a portion of the second surface, wherein the first encapsulant contacts the first surface of the carrier, and the second encapsulant contacts the second surface of the carrier;
   a first electronic component disposed on the second surface of the carrier and exposed by the second encapsulant; and
   a second electronic component disposed on the second surface of the carrier, wherein at least three sides of the second electronic component are encapsulated by the second encapsulant,
   wherein a thickness of the first component is greater than a thickness of the second electronic component.

3. The semiconductor device package of claim 2, wherein the carrier has a first edge and a second edge opposite to the first edge, the second electronic component is closer to the second edge than to the first electronic component, a distance between the second electronic component and the second edge of the carrier is less than a distance between the first electronic component and the first edge of the carrier.

4. The semiconductor device package of claim 1, further comprising a third electronic component disposed over the first surface of the carrier, wherein the carrier has a first side and a second side opposite to the first side in a top view, wherein the first interposer is closer to the first side than the third electronic component is, and wherein the third electronic component is closer to the second side than the first interposer is.

5. The semiconductor device package of claim 1, further comprising a fourth electronic component disposed over the first surface of the carrier, wherein in a top view, the first interposer overlaps the fourth electronic component in a first direction, and the first interposer does not overlap the fourth electronic component in a second direction substantially perpendicular to the first direction.

6. A semiconductor device package, comprising:
   a carrier having a first surface and a second surface opposite to the first surface;
   a first interposer disposed over the first surface;
   a first encapsulant encapsulating the first interposer and interposed between the first interposer and the carrier;
   a second encapsulant disposed under the second surface and exposing a portion of the second surface, wherein the first encapsulant contacts the first surface of the carrier, and the second encapsulant contacts the second surface of the carrier; and
   a plurality of solder balls, wherein the first interposer includes a plurality of conductive vias, wherein some of the plurality of conductive vias are disposed on some of the plurality of solder balls.

7. The semiconductor device package of claim 6, wherein one of the plurality of solder balls is connected to a respective one of the plurality of conductive vias.

8. The semiconductor device package of claim 1, further comprising a fifth electronic component disposed over the first surface of the carrier, wherein a distance between a bottom surface of the fifth electronic component and the carrier is greater than a distance between the first interposer and the carrier.

9. The semiconductor device package of claim 1, further comprising:
   a sixth electronic component and a seventh electronic component disposed under the second surface of the carrier; and
   a shielding structure extending from a top surface of the second encapsulant to a bottom surface of the second encapsulant, and separating the sixth electronic component from the seventh electronic component.

10. The semiconductor device package of claim 9, wherein the shield structure tapers toward the carrier.

* * * * *